United States Patent
Mishra et al.

(10) Patent No.: US 9,225,560 B1
(45) Date of Patent: Dec. 29, 2015

(54) DATA RATE PROGRAMMING USING SOURCE DEGENERATED CTLE

(71) Applicant: INPHI CORPORATION, Santa Clara, CA (US)

(72) Inventors: Parmanand Mishra, Thousand Oaks, CA (US); Michael S. Harwood, Rushden (GB)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/681,989

(22) Filed: Apr. 8, 2015

(51) Int. Cl.
*H04L 25/06* (2006.01)
*H04L 25/10* (2006.01)
*H04L 25/03* (2006.01)
*H03K 17/687* (2006.01)

(52) U.S. Cl.
CPC ........ *H04L 25/03019* (2013.01); *H03K 17/687* (2013.01); *H04L 25/03885* (2013.01)

(58) Field of Classification Search
CPC ... H04L 25/063; H04L 25/061; H04L 25/062; H04L 27/2647; H04B 1/30; H04N 5/4401
See application file for complete search history.

(56) References Cited

U.S. PATENT DOCUMENTS

| | | | |
|---|---|---|---|
| 2005/0248382 A1* | 11/2005 | Chung et al. | 327/362 |
| 2006/0022744 A1* | 2/2006 | Wu | 327/541 |
| 2014/0192841 A1* | 7/2014 | Zhan et al. | 375/130 |

* cited by examiner

*Primary Examiner* — Ted Wang
(74) *Attorney, Agent, or Firm* — Richard T. Ogawa; Ogawa P.C.

(57) ABSTRACT

The present invention is directed to data communication systems and methods. In various embodiments, the present invention provides a CML device that changes output frequency response by varying resistance values of its load resistance and source resistance. A bias control voltage is used to adjust the tail current of the CML device, and the tail current adjusts the output gain of the CML device. There are other embodiments as well.

19 Claims, 5 Drawing Sheets

DATA RATE PROGRAMMING USING SOURCE DEGENERATED CTLE

BACKGROUND OF THE INVENTION

The present invention is directed to data communication systems and methods.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, current-mode logic (CML) is often used as a part of a communication interface.

Over the past, there have been many types of communication systems and methods. Unfortunately, they have been inadequate for various applications. More specifically, the CMLs of existing communication systems are often inadequate. Therefore, improved systems and methods are desired.

BRIEF SUMMARY OF THE INVENTION

The present invention is directed to data communication systems and methods. In various embodiments, the present invention provides a CTLE device that changes output frequency response by varying resistance values of its load resistance and source resistance. A bias control voltage is used to adjust the tail current of the CTLE device, and the tail current adjusts the output gain of the CTLE device. There are other embodiments as well.

According to an embodiment, the present invention provides a continuous time linear equalizer device. The device includes a first input and a second input for receiving data. The device also includes a first transistor comprising a first gate and a first output terminal and a first source terminal. The first gate is electrically coupled to the first input. The device further includes a second transistor comprising a second gate and a second output terminal and a second source terminal. The second gate is electrically coupled to the second input. The device additionally includes a first resistor module comprising a first plurality of resistors. The first resistor module is coupled to the first output terminal. The first resistor module is characterized by a first variable resistance value. The device additionally includes a second resistor module comprising a second plurality of resistors. The second resistor module is coupled to the second output terminal. The second resistor module is characterized by a second variable resistance value, which is substantially equal to the first variable resistance value. The device additionally includes a third resistor module comprising a third plurality of resistors. The third resistor module is coupled to the first source terminal and the second source terminal. The third resistor module is characterized by a third variable resistance value. The device additionally includes a third transistor module comprising a third gate and a first drain terminal. The first drain terminal is electrically coupled to the first source terminal. The device further includes a comparator being configured to generate a bias voltage based on at least a common output voltage and a reference voltage. The bias voltage is electrical coupled to the third gate.

According to another embodiment, the present invention provides a communication system. The system includes a first communication line and a second communication line. The system also includes a control module. The system additionally includes a CTLE coupled to the first communication line and the second communication line. The CTLE includes a first input and a second input for receiving data. The CTLE also includes a first transistor comprising a first gate and a first output terminal and a first source terminal. The first gate is electrically coupled to the first input. The CTLE also includes a second transistor comprising a second gate and a second output terminal and a second source terminal. The second gate is electrically coupled to the second input. The CTLE additionally includes a first resistor module comprising a first plurality of resistors. The first resistor module is coupled to the first output terminal. The first resistor module is characterized by a first variable resistance value. The first variable resistance value is adjustable in response to control signals from the control module. The CTLE further includes a second resistor module comprising a second plurality of resistors. The second resistor module is coupled to the second output terminal. The second resistor module is characterized by a second variable resistance value, which is substantially equal to the first variable resistance value. The CTLE further includes a third resistor module comprising a third plurality of resistors. The third resistor module is coupled to the first source terminal and the second source terminal. The third resistor module is characterized by a third variable resistance value. The CTLE also includes a third transistor module comprising a third gate and a first drain terminal, which is electrically coupled to the first source terminal. The CTLE further includes a comparator being configured to generate a bias voltage based on at least a common output voltage and a reference voltage. The bias voltage is electrical coupled to the third gate.

According to yet another embodiment, the present invention provides a continuous time linear equalizer device. The device includes a first input and a second input for receiving data. The device also includes a first transistor comprising a first gate and a first output terminal and a first source terminal. The first gate is electrically coupled to the first input. The device also includes a second transistor comprising a second gate and a second output terminal and a second source terminal. The second gate is electrically coupled to the second input. The device additionally includes a first resistor module comprising a first plurality of resistors, the first resistor module being coupled to the first output terminal. The first resistor module is characterized by a first variable resistance value. The device additionally includes a second resistor module comprising a second plurality of resistors. The second resistor module is coupled to the second output terminal. The second resistor module is characterized by a second variable resistance value, which is substantially equal to the first variable resistance value. The device further includes a third resistor module comprising a third plurality of resistors. The third resistor module is coupled to the first source terminal and the second source terminal. The third resistor module is characterized by a third variable resistance value. The device also includes a third transistor module comprising a third gate and a first drain terminal. The first drain terminal is electrically coupled to the first source terminal. The device further includes a comparator that is configured to generate a bias voltage based on a control signal.

It is to be appreciated that embodiments of the present invention provide many advantages over conventional systems. Through using both variable resistor modules and feedback control, output frequency response and gain of the CML can be controlled. Additionally, since DACs are used to control resistor modules, embodiments of the present invention are compatible with a variety of equalization systems, including adaptive equalization schemes such as decision feedback equalization (DFE). Embodiments of the presentation can be provided using existing semiconductor manufacturing processes, and thus can be inexpensively implemented in a range of systems. There are other benefits as well.

DETAILED DESCRIPTION OF THE INVENTION

The present invention is directed to data communication systems and methods. In various embodiments, the present invention provides a CTLE device that changes output frequency response by varying resistance values of its load resistance and source resistance. A bias control voltage is used to adjust the tail current of the CTLE device, and the tail current adjusts the output gain of the CTLE device. There are other embodiments as well.

Current mode logic, as mentioned above, has a wide range of applications. Among other features, CML provides fast operation and low power consumption, which makes it suitable for high-speed communication applications. For low-power and high-speed communication systems, such as optical communication network, CML can be used as a part of a device interface. In addition to being used in optical networks, CMLs have been used in various type of video links, such as HDMI, DVI, and others. It is to be understood that the CML and CTLE devices described in the application are generally implemented using source degenerated devices, which provide substantially linear output gain.

Used as buffers, CMLs have been implemented in tapered buffer chains, serializer-deserializer (SerDes) circuits, clock and data recover (CDR), multiplexers, and many others. With relatively low voltage swings, compared to static CMOS circuits, CML provides high-speed operation that is important for interface and communication applications. For example, CML can operates at a speed well over 200 Mbit/s.

Figure 1:
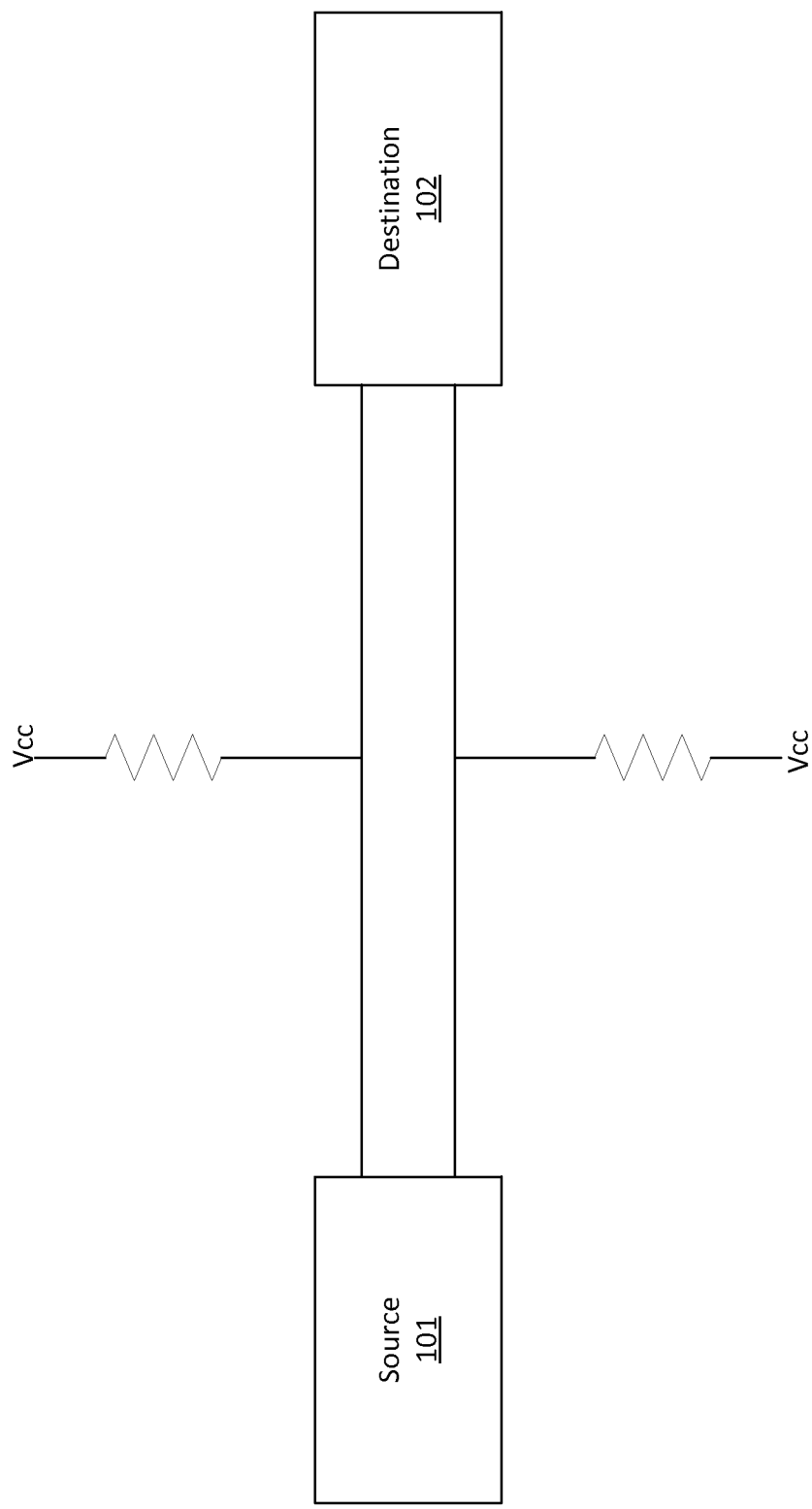
FIG. 1 is a simplified diagram illustrating connecting CML to a pair of communication line.

FIG. 1 is a simplified diagram illustrating connecting CML to a pair of communication line. For example, a set of differential lines is provided between the source 101 and the destination 102. A voltage Vcc of the CML is coupled to both of the differential lines respectively via resistors.

Figure 2:
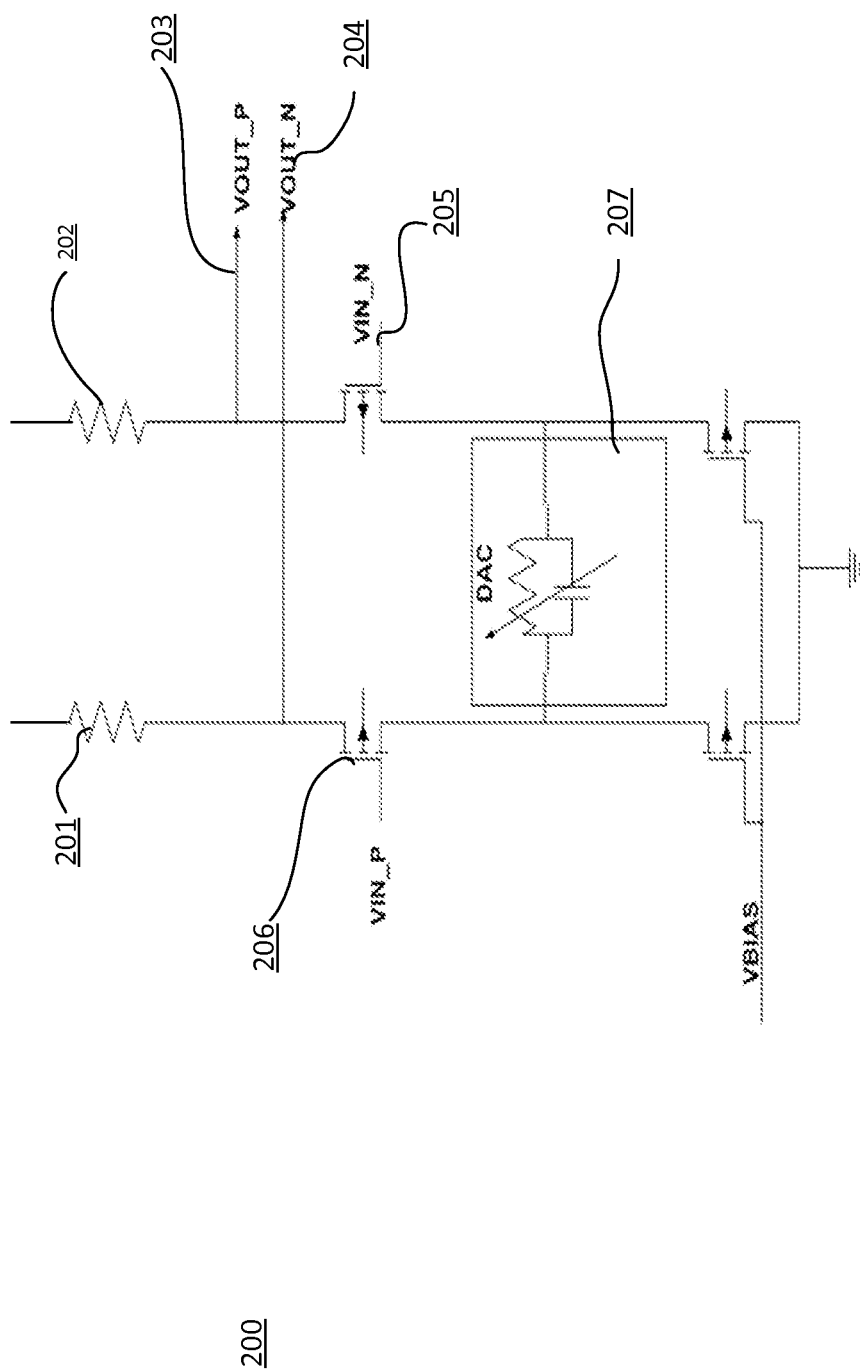
FIG. 2 is a simplified diagram illustrating a convention CML.

FIG. 2 is a simplified diagram illustrating a convention CML. As shown in FIG. 2, a pair of differential inputs Vin_P 206 and Vin_N 205 is respectively coupled to a pair of CMOS transistors. A variable impedance module 207 controls a bank of capacitors and/or resistors gates. For example, by varying capacitor and/or resistor values, the source voltages of CMOS transistors can be changed, thus altering output voltages, and zeroes and poles of the output response. As shown, the outputs pair Vout_P 203 and Vout_N 204 are respectively coupled to resistors 201 and 202. For example, as shown in FIG. 1, a CML is typically coupled to communication lines with resistors. Resistors 201 and 202 are coupled to a drain voltage $V_{DD}$. Depending on the application, it might be desirable to move the zeroes and poles of the output voltage without changing the magnitude of the voltages. For example, zeroes and poles can be moved by changing electrical properties of the load resistors 201 and 202, or changing source load (e.g., impedance module 207).

In various data communication applications, equalization and is often needed to change output frequency response and compensate high frequency loss in the communication, and the equalization is often applied at the CML stage. For example, many SerDes transceivers utilize receiver equalizers to compensate the channel attenuation (loss). By providing equalization to compensate high frequency loss in commmunication channel, the range of SerDes link is extended. Embodiments of the present invention allow data rate to be changed on continuous time linear equalizers (CTLE) while substantially maintaining the output voltage level while changing the output frequency response as needed. For example, CMLs according to the embodiments of the present invention may be referred to as CTLEs, since the CMLs specifically configured to provide CTLE functionalities.

In general, designing a high bandwidth and high gain system that works at different data rates is challenging. Among other things, practical designs have been concerned with power and area penalties. For example, a common approach involves having different resistor and capacitor (RC) degenerated equalizer circuits for different data rates. Some other conventional approach involves using the same RC degenerated circuit and to obtain different data rates through changing the tail current, resistor, and capacitors. Unfortunately, conventional systems and techniques have been inadequate. It is to be appreciated that embodiments of the present invention provide systems and methods that move the output frequency response by changing resistor values, and tail current is changed to compensate according to the corresponding data rates. More specifically, a CML according to embodiment of the present invention uses a feedback voltage based on the common mode output to adjust the tail current via an op-amp, and the tail current is used to power the RC generated stage of the CML. When the resistor values, both at the output stage and tail current stage, the op-amp changes the current to adjust the power output accordingly. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 3:
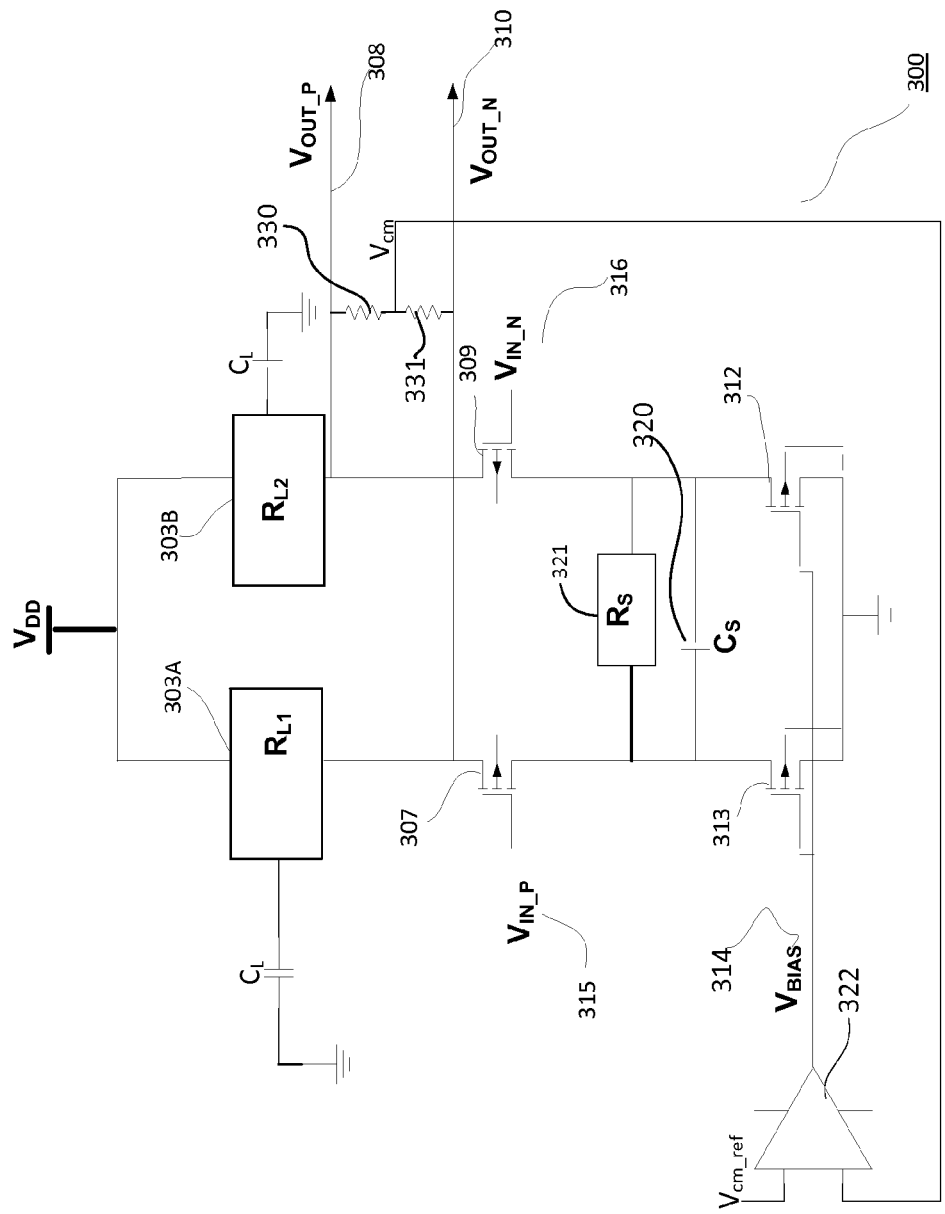
FIG. 3 is a simplified diagram illustrating a current mode logic device according to an embodiment of the present invention.

FIG. 3 is a simplified diagram illustrating a current mode logic device according to an embodiment of the present invention. This diagram is merely an example, which should not unduly limit the scope of the claims. One of ordinary skill in the art would recognize many variations, alternatives, and modifications. A CTLE device 300 receives input 315 $V_{IN\_P}$ and input 316 $V_{IN\_N}$. As an example, the CTLE device 300 may be based on a CML device, as it is configured to provide CTLE functionalities of adjusting output gain and frequency response. For example, the first input 315 and the second input 316 are coupled to a pair of data transmission lines. The first input 315 and the second input 316 are respectively coupled to the gates of transistors 307 and 316. It is to be understood that while MOS devices are shown as transistors, other types of transistor devices may be used as well, such as bipolar junction transistor (BJT) devices uses in early implementation of CMLs, and other types of transistor devices. While operating under similar operating principles, MOS or CMOS devices are preferred over BJT devices for their high speed and low voltage. Each of the transistors 307 and 316 comprises a drain terminal and a source terminal. The drain terminals of the transistors 307 and the 316 respectively provide a first output ($V_{OUT\_N}$) 310 and a second output ($V_{OUT\_P}$) 308.

The outputs, both in magnitude and frequency response, of the CTLE 300 are affected by a number of electrical characteristics. The tail current $I_{SS}$ is coupled to the source terminals of the transistors 307 and 316, and it provides an input-independent biasing for the CTLE device 300. CTLE 300, similar various types of CML devices, operates at a relatively low voltage, and differential voltage swing at the output is around the device threshold voltage. For example, the output swing voltage can be defined by the tail current ($I_{SS}$) and load resistance ($R_L$) as $I_{SS}*R_L$, where the upper bound is $V_{DD}$ and $R_L$ is the load impedance coupled to the output 308 and 310. The load capacitors $C_L$ are coupled to the load resistor modules 303A and 303B, which provides an RL time component. Since the tail current is also electrically coupled to the source impedance module 321 ($R_S$) and source capacitor 320 ($C_S$), the various electrical properties of the tail current, such as magnitude and frequency, are affected by the impedance module 321 and the source capacitor 320. In various embodiments, the impedance of the source impedance module 321 is large enough so that the transconductance $g_m$ of the transistors is much greater than $1/R_S$, as expressed in Equation 1 below:

$$g_m \gg \frac{1}{R_S} \quad \text{Equation 1}$$

In operating condition defined by Equation 1, the DC gain of can be defined under Equation 2 below:

$$\text{DC gain} = -\frac{R_L}{R_S} \quad \text{Equation 2}$$

For the output frequency, the zero frequency of can be defined by Equation 3 below:

$$f_{zero} = -\frac{1}{2\pi R_S C_S} \quad \text{Equation 3}$$

And the pole frequency can be defined by Equation 4 below:

$$f_{pole} = -\frac{1}{2\pi R_L C_L} \quad \text{Equation 4}$$

Based on the relationships defined according to the above equations, it can be seen that that both magnitude and frequency of the output can be adjusted by changing the value of various electrical components. For example, change of output gain can be accomplished by changing the ratio between the load resistor value and the source resistor value. Similarly, to change the output frequency response, zero frequency can be changed by changing the source resistor value, and the pole frequency can be changed by changing the load resistor value.

In various application involving data communication, it is often desirable to move the output frequency response without changing the output magnitude. For example, in a data communication line operates at two or more frequencies, it is desirable to switch from one frequency to another, while keeping the signal magnitude at substantially the same level. It is to be appreciated that the CTLE 300, with variable impedance modules at both load and source terminals, can change both frequency and magnitude of the output lines as needed, and for data communication applications, it is capable of changing frequency response without changing magnitude of the output lines.

The CTLE 300 adjusts the output frequency response by changing the load resistance and the source resistance. To increase the zero and pole frequencies, both load resistance and the source resistance are decreased. For example, impedance modules 303A and 303B can be implemented using switched resistor arrays.

Figure 4:
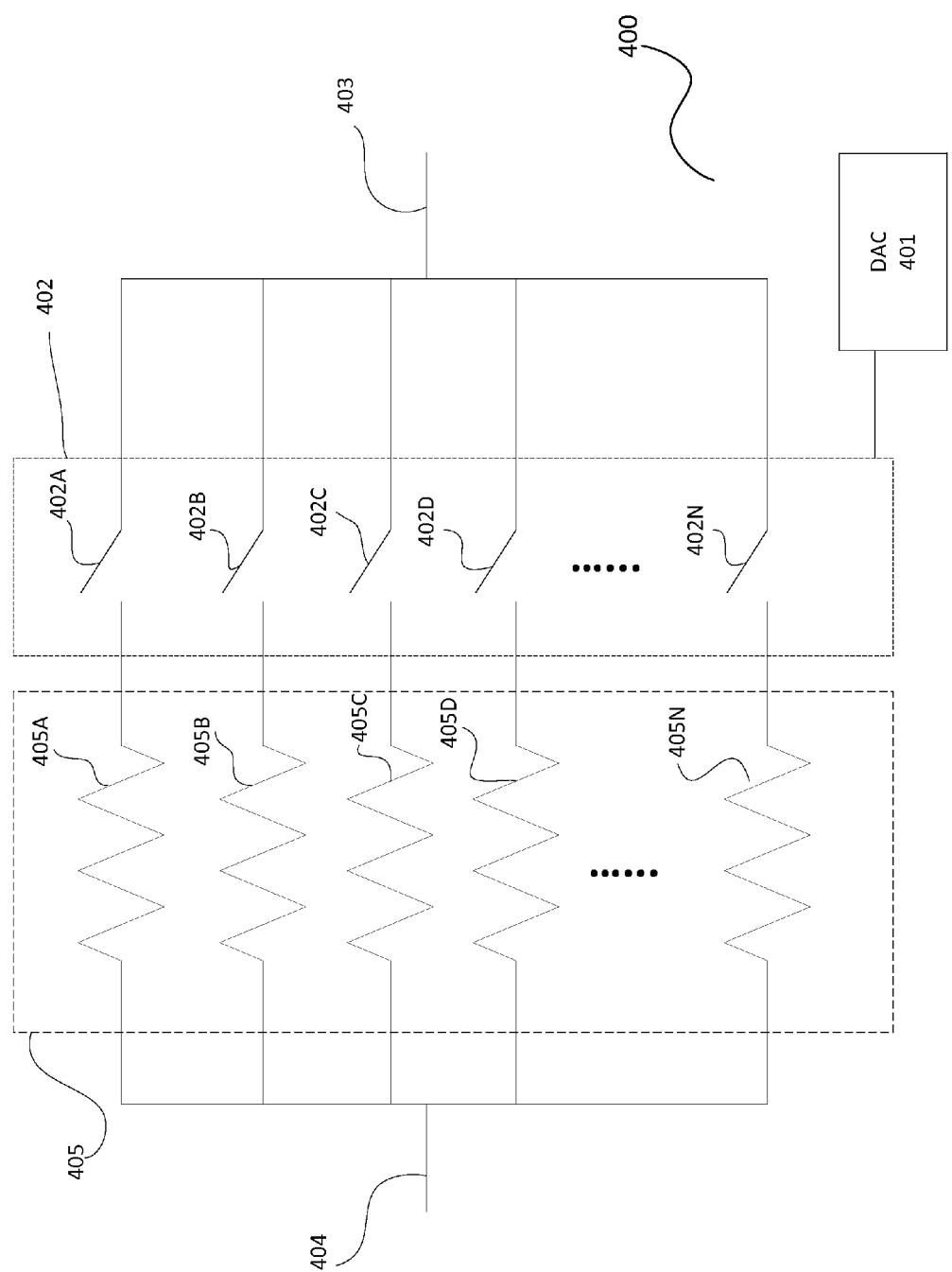
FIG. 4 is a simplified diagram illustrating a switched resistor array 400 according to an embodiment of the present invention.

FIG. 4 is a simplified diagram illustrating a switched resistor array 400 according to an embodiment of the present invention. This diagram is merely an example, which should not unduly limit the scope of the claims. One of ordinary skill in the art would recognize many variations, alternatives, and modifications. The switched resistor array 400 comprises two terminals 403 and 404 for connecting to other electrical components. For example, used as $R_S$ resistor 321 in FIG. 3, terminals 403 and 404 of the switched resistor array 400 are respectively coupled to the source terminals of transistors 307 and 309, and the resistor array 400 itself is thus configured in series with the capacitor 320. The configuration of the switched resistor array 400 can also be used for the load resistors 303A and 303B. In various embodiments, the load resistors 303A and 303B, which are implemented according to the configuration of the switched resistor array 400, match each other in their respective resistance values. In certain embodiments, the CTLE 300 receives control signals from a control module. The control signals cause change in resistance values for the load and source resistors, and these changes cause shift in output frequency response.

As shown in FIG. 4, a plurality of resistors 405 comprises N resistors 405A-405N configured in parallel to one another. Each of the resistors is respectively connected in series to a corresponding switch of the switch array 402, which comprises N switches. For example, switch 402A is configured in series with the resistor 405A, switch 402B is configured in series with resistor 405B, and so on. By selectively switching on one or more switches, the resistance value of the resistor array can be adjusted accordingly. Since resistors are disengageably connected to one another in parallel, but connecting (i.e., closing the switches) additional resistors in series, the resistance value of the resistor array 400 is lowered. For example, in a first operational mode, only switch 402A is closed, which means that the resistance value $R_{400}$ of the resistor array 400 is that of the resistor 405A. By closing switches 402A and 402B, the resistance value of the resistor array 400 is $R_{400}=(R_{405A}*R_{405B})/(R_{405A}+R_{405B})$, and $R_{400}$ is less than the resistance $R_{405A}$ of resistor 405A alone. In the same manner, by closing additional switches, the resistance value $R_{400}$ of the resistor array 400 is further reduced. The smallest resistance value $R_{400}$ can be achieved by closing all the switches 402A-402N, which means resistors 405A-405N are all connected in parallel.

Depending on the specific implementation, the switch array 402 can be controlled in various ways. In an embodiment, the switch array is coupled to DAC 401, which provides switching control. For example, the logic that determines which switch(es) to turn on is predetermined based on the desired resistance values. As explained above, since the DC gain value is determined by the ratio between the load resistors $R_L$, and source resistor $R_S$, the resistance values of load resistors $R_L$, and the source resistor $R_S$ are coordinated to keep the DC gain substantially constant. For example, when the resistance value of the load resistors $R_L$, is reduced by 50%, the resistance value of the source resistor $R_S$ is also reduced by 50%, and the ratio of $R_L/R_S$ stays the same. Since the load resistors are respectively coupled to the output terminals, the resistance value of the two load resistors (e.g., load resistors 303A and 303B in FIG. 3) is substantially the same. For example, matching sets of resistors are switched to keep the load resistances match.

Now referring back to FIG. 3. By varying the resistance values of the load resistors and the source resistor, the zero frequency and the pole frequency of the output response can be adjusted in accordance with Equation 3 and Equation 4 above. For example, to work with a higher data rate, lower resistance values for the load and source resistors are used (e.g., connecting more resistors in parallel); lowering the resistance of the source resistor increases the zeroes frequency, and lowering the resistance of the load resistor increases the pole frequency. However, adjusting frequency response is more than just changing resistances of the load and source resistors. As load and source resistors change their resistance values, the DC gain at the output 308 and 310 also changes, even as the system keeps the ratio of $R_L/R_S$ substantially constant. It is to be appreciated that in embodiments of the present invention utilize a feedback loop to keep the output DC gain in check. As shown in FIG. 3, a common voltage $V_{cm}$, which is provided between the resistors 330 and 331, is based on the CML outputs 308 and 310. The common voltage $V_{cm}$ is feed into comparator 322, which compares the common voltage $V_{cm}$ against a reference common voltage $V_{cm}$, and the output $V_{BIAS}$ of the comparator 322 is used to control the gates of transistors 312 and 313. By controlling the gates of the transistors 312 and 313, the tail current $I_{SS}$ can be adjusted. The change in tail current $I_{SS}$ in turn changes the output DC gain. As explained above, the output voltage is essentially $I_{SS}*R_L$. When $R_L$, is lowered to increase the pole frequency of the output, the gate bias voltage $V_{BIAS}$ is changed, and as a result the tail current $I_{SS}$ is increased to compensate the drop in $R_L$, resistance value, and the output voltage and DC gain are maintained at a substantially same level. This is because the common mode output voltage, as explained above, is $V_{DD}-I_{SS}*R_L$. Similarly, by increasing load resistance, pole is moved to a lower frequency, and the tail current $I_{SS}$ is lowered accordingly.

In certain embodiments, the output voltage and DC gain are adjusted by manually controlling the $V_{BIAS}$ voltage. In a specific embodiment, a current DAC is used to generate the $V_{BIAS}$ voltage based on the desired CML output voltage. There can be other variations as well.

Figure 5:
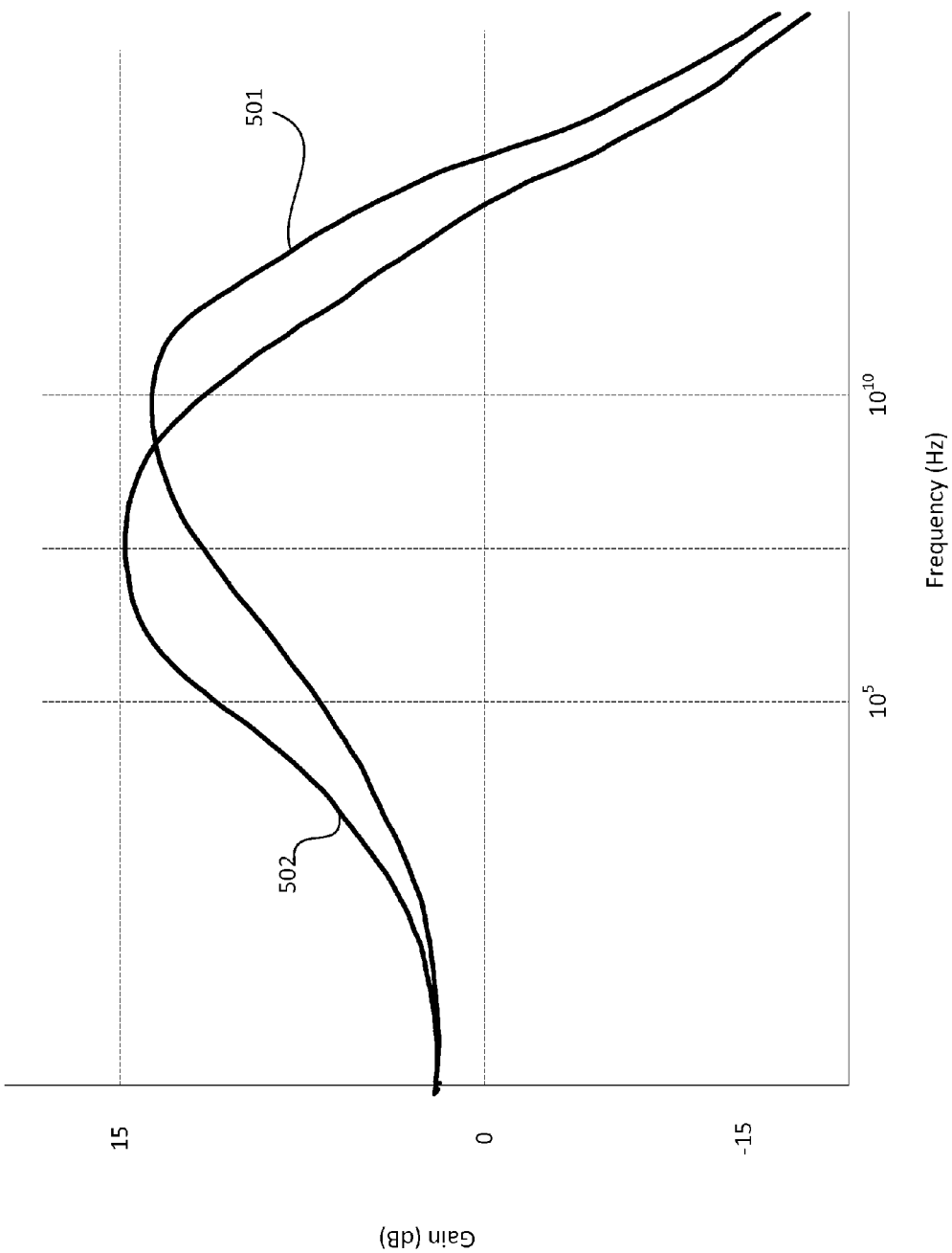
FIG. 5 is a graph illustrating the output of a CML according to an embodiment of the present invention.

FIG. 5 is a graph illustrating the output of a CTLE according to an embodiment of the present invention. This diagram is merely an example, which should not unduly limit the scope of the claims. One of ordinary skill in the art would recognize many variations, alternatives, and modifications. In FIG. 5, curves 501 and 502 depicts output of a CML device according to an embodiment of the present (e.g., CTLE 300 in FIG. 3). As can be seen in FIG. 3, the pole frequency of the curve 502 is at around $5\times10^{10}$ Hz (e.g., 5 GHz data rate), and its zero frequency is lower than that of the curve 501. By lowering the load resistance and adjusting $V_{BIAS}$ based on a predetermined configuration (e.g., a set of matching load and source resistance values), the output is shifted to the output response depicted by curve 501, where the pole frequency of the curve 501 is at around $10\times10^{10}$ Hz (e.g., 10 GHz data rate). It is to be noted that with the feedback mechanism that adjust the $V_{BIAS}$, the output voltage and DC gain stay at approximately the same level when the CML system operating at different frequencies. It is to be appreciated that CTLE systems according to embodiments of the present invention allow for operating at different frequency and data rates, which is useful for various types of data communication systems.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A continuous time linear equalizer device comprising:
a first input and a second input for receiving data;
a first transistor comprising a first gate and a first output terminal and a first source terminal, the first gate being electrically coupled to the first input;
a second transistor comprising a second gate and a second output terminal and a second source terminal, the second gate being electrically coupled to the second input;

a first resistor module comprising a first plurality of resistors, the first resistor module being coupled to the first output terminal, the first resistor module being characterized by a first variable resistance value;

a second resistor module comprising a second plurality of resistors, the second resistor module being coupled to the second output terminal, the second resistor module being characterized by a second variable resistance value, the second variable resistance value being substantially equal to the first variable resistance value;

a third resistor module comprising a third plurality of resistors, the third resistor module being coupled to the first source terminal and the second source terminal, the third resistor module being characterized by a third variable resistance value;

a third transistor module comprising a third gate and a first drain terminal, the first drain terminal being electrically coupled to the first source terminal; and a comparator being configured to generate a bias voltage based on at least a common output voltage and a reference voltage, the bias voltage being electrical coupled to the third gate.

2. The device of claim 1 wherein the first plurality of resistors are configured in parallel.

3. The device of claim 1 further comprising a fourth transistor module comprising a fourth gate and a second drain terminal, the second drain terminal being electrically coupled to the second source terminal.

4. The device of claim 1 wherein the first drain terminal is electrically coupled to third resistor module.

5. The device of claim 1 further comprising a capacitor configured in parallel to the third resistor module.

6. The device of claim 1 further comprising a first resistor and a second resistor, the common output voltage being coupled to the first output terminal via the first resistor and coupled to the second output terminal via the second resistor.

7. The device of claim 1 wherein the first resistance value corresponds to a predetermined data rate.

8. The device of claim 1 wherein a ratio between the first resistance value and the third resistance value corresponds to a predetermined output gain level.

9. The device of claim 1 wherein the third resistance value corresponds to a zero frequency of an output voltage.

10. The device of claim 1 wherein the first resistor module comprises a DAC for selecting the first plurality of resistors.

11. A communication system comprising:
a first communication line and a second communication line;
a control module;
a CTLE coupled to the first communication line and the second communication line, wherein the CTLE comprises:
a first input and a second input for receiving data;
a first transistor comprising a first gate and a first output terminal and a first source terminal, the first gate being electrically coupled to the first input;
a second transistor comprising a second gate and a second output terminal and a second source terminal, the second gate being electrically coupled to the second input;
a first resistor module comprising a first plurality of resistors, the first resistor module being coupled to the first output terminal, the first resistor module being characterized by a first variable resistance value, the first variable resistance value being adjustable in response to control signals from the control module;

a second resistor module comprising a second plurality of resistors, the second resistor module being coupled to the second output terminal, the second resistor module being characterized by a second variable resistance value, the second variable resistance value being substantially equal to the first variable resistance value;

a third resistor module comprising a third plurality of resistors, the third resistor module being coupled to the first source terminal and the second source terminal, the third resistor module being characterized by a third variable resistance value;

a third transistor module comprising a third gate and a first drain terminal, the first drain terminal being electrically coupled to the first source terminal; and a comparator being configured to generate a bias voltage based on at least a common output voltage and a reference voltage, the bias voltage being electrical coupled to the third gate.

12. The system of claim 11 wherein the control module is configured to generate the control signals based on a predetermined data rates.

13. The system of claim 11 wherein the third plurality of resistors are configured in parallel.

14. The system of claim 11 wherein the first communication line comprises an optical communication line.

15. The system of claim 11 further comprising a SerDes module coupled to the first output terminal and the second output terminal.

16. A continuous time linear equalizer device comprising:
a first input and a second input for receiving data;
a first transistor comprising a first gate and a first output terminal and a first source terminal, the first gate being electrically coupled to the first input;
a second transistor comprising a second gate and a second output terminal and a second source terminal, the second gate being electrically coupled to the second input;
a first resistor module comprising a first plurality of resistors, the first resistor module being coupled to the first output terminal, the first resistor module being characterized by a first variable resistance value;
a second resistor module comprising a second plurality of resistors, the second resistor module being coupled to the second output terminal, the second resistor module being characterized by a second variable resistance value, the second variable resistance value being substantially equal to the first variable resistance value;
a third resistor module comprising a third plurality of resistors, the third resistor module being coupled to the first source terminal and the second source terminal, the third resistor module being characterized by a third variable resistance value;
a third transistor module comprising a third gate and a first drain terminal, the first drain terminal being electrically coupled to the first source terminal; and
a comparator being configured to generate a bias voltage based on a control signal; wherein the control is provided by a current DAC module.

17. The device of claim 16 further comprising a control module for generating the control signal.

18. The device of claim 16 further comprising a capacitor electrically coupled to the first resistor module.

19. The device of claim 16 wherein the bias voltage is coupled to the third gate.

* * * * *